United States Patent
Biber

(10) Patent No.: US 9,118,101 B2
(45) Date of Patent: Aug. 25, 2015

(54) SIGNAL PATH FOR A SMALL SIGNAL OCCURRING IN A MAGNETIC RESONANCE SYSTEM

(75) Inventor: Stephan Biber, Erlangen/Frauenaurach (DE)

(73) Assignee: Siemens Aktiengesellschaft, München (DE)

( * ) Notice: Subject to any disclaimer, the term of this patent is extended or adjusted under 35 U.S.C. 154(b) by 646 days.

(21) Appl. No.: 13/458,887

(22) Filed: Apr. 27, 2012

(65) Prior Publication Data

US 2013/0106537 A1    May 2, 2013

(30) Foreign Application Priority Data

Apr. 29, 2011 (DE) .................. 10 2011 017 798

(51) Int. Cl.
*H01P 3/16* (2006.01)
*G01R 33/36* (2006.01)

(52) U.S. Cl.
CPC .............. *H01P 3/16* (2013.01); *G01R 33/3621* (2013.01); *G01R 33/3692* (2013.01)

(58) Field of Classification Search
CPC ... G01R 33/3621; G01R 33/3692; H01P 3/16
See application file for complete search history.

(56) References Cited

U.S. PATENT DOCUMENTS

| 5,949,311 A * | 9/1999 | Weiss et al. ............... 333/202 |
| 8,587,315 B2 * | 11/2013 | Kayano ...................... 324/318 |
| 2007/0182409 A1 | 8/2007 | Varjo |

FOREIGN PATENT DOCUMENTS

WO    WO 2006/008665 A1    1/2006

OTHER PUBLICATIONS

German Office Action dated Dec. 14, 2011 for corresponding German Patent Application No. DE 10 2011 017 798.1 with English translation.
C. Yeh, et al., "The Essence of Dielectric Waveguides," California Advanced Studies, Los Angeles, USA, pp. 1-528, 2008.
J. Richter, et al., "A Broadband Transition between Dielectric and Planar Waveguides at Millimeterwave Frequencies," Lehrstuhl für Hochfrequenztechnik, Universität Erlangen-Nürnberg, Germany, pp. 947-950, 2003.

* cited by examiner

*Primary Examiner* — Dixomara Vargas
(74) *Attorney, Agent, or Firm* — Lempia Summerfield Katz LLC

(57) ABSTRACT

A signal path for a small signal oscillating at a frequency of at least 20 GHz occurring in a magnetic resonance system has a signal source generating the small signal and a signal sink processing the small signal. The small signal is transmitted on a path from the signal source to the signal sink at least in a part section via a cable. The part section of the signal path, in which the small signal is transmitted via the cable, is embodied at least partly as a dielectric waveguide. The dielectric waveguide is disposed at least partly within an examination volume of the magnetic resonance system. The dielectric waveguide is delimited on a source side by a source-side mode converter and on a sink side, by a sink-side mode converter. The small signal is supplied to the source-side mode converter via a source-side electrical conductor and injected by the sink-side mode converter into a sink-side electrical conductor.

17 Claims, 3 Drawing Sheets

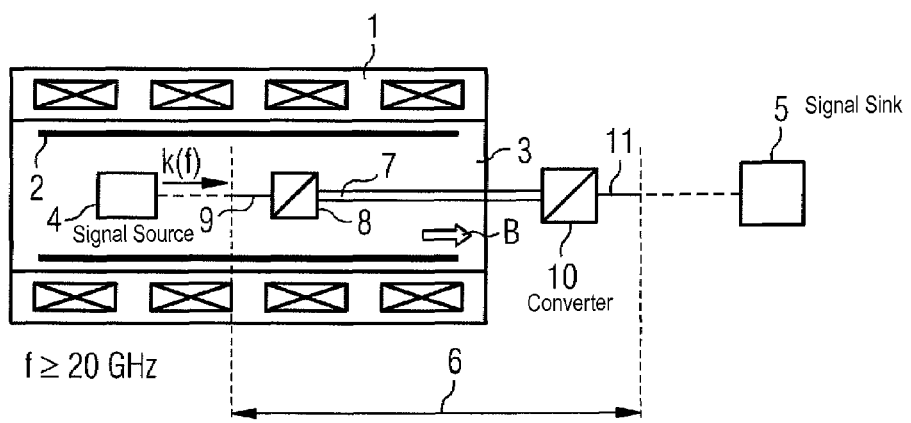
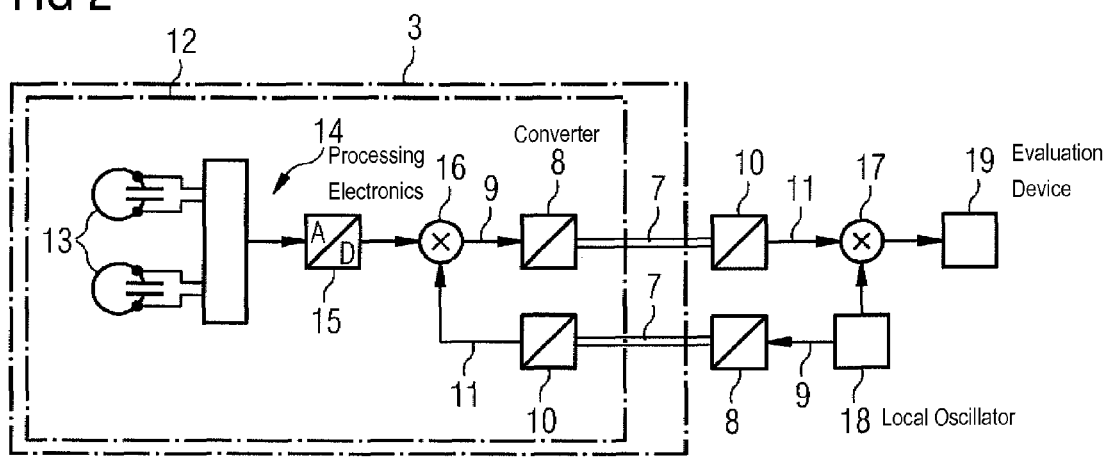

SIGNAL PATH FOR A SMALL SIGNAL OCCURRING IN A MAGNETIC RESONANCE SYSTEM

This application claims the benefit of DE 10 2011 017 798.1, filed on Apr. 29, 2011.

BACKGROUND

The present embodiments relate to a signal path for a small signal oscillation at a frequency of at least 20 GHz occurring in a magnetic resonance system.

Magnetic resonance systems have an examination volume. The examination volume is the volume, in which the static, locally essentially homogeneous basic magnetic field of the magnetic resonance system exists and to which magnetic resonance excitation pulses may be applied by the whole body coil of the magnetic resonance system. All metallic cables that run in the examination volume are to be equipped with sheath current filters in order to prevent sheath waves being induced on the cable sheaths. This practice may be known to persons skilled in the art.

Various signals occur in magnetic resonance systems. The signals are power signals such as the high-frequency magnetic resonance excitation pulses or gradient pulses, for example. The signals are also, for example, small signals such as magnetic resonance signals, control signals (e.g., for tuning circuits), and clock signals. Power signals are to be conducted via metallic conductors. Small signals are likewise initially transmitted via cables in the prior art. However, the use of radio links with or without frequency conversion for the transmission of small signals is also known.

The magnetic resonance signals may be digitized while the magnetic resonance signals are still in the local coil, and the received magnetic resonance signals may be transferred in digitized form to the control and evaluation device of the magnetic resonance system. A high bandwidth for transfer of the digitized magnetic resonance signal is provided in this case. This uses high transmission frequencies of 20 GHz and more. The problem that arises is that of how such high-frequency signals may be transferred from the local coil to the control and evaluation device.

In one approach, the signals are transferred via a corresponding high-frequency radio link. Because of the strongly distinct directional characteristic of the emitting signal, this approach is prone to problems. These problems may be resolved.

A further approach is cable-based transmission. This approach too is prone to problems. For example, planar cable structures such as striplines exhibit high losses at these high frequencies. Although hollow conductor systems exhibit lower losses, the hollow structures are however voluminous and may only be installed with mechanical difficulty. It is a complicated matter to combine the two solutions with sheath current filters known in the prior art.

SUMMARY AND DESCRIPTION

The present embodiments may obviate one or more of the drawbacks or limitations in the related art. For example, options for enabling small signals occurring in a magnetic resonance system oscillating at a frequency of at least 20 GHz to be transmitted in a simple manner are provided.

In accordance with the present embodiments, in a signal path for a small signal occurring in a magnetic resonance system oscillating at a frequency of at least 20 GHz, the signal path may have a signal source generating the small signal and a signal sink processing the small signal. The small signal, on the way from the signal source to the signal sink, may be transmitted over a cable in at least one part section. The part section of the signal path, in which the small signal is transmitted over a cable, may be embodied at least partly as a dielectric waveguide. The dielectric waveguide may be disposed at least partly within an examination volume of the magnetic resonance system. The dielectric waveguide may be delimited on the source side by a source-side mode converter and on the sink side, by a sink-side mode converter. The small signal may be supplied to the source-side mode converter via a source-side electrical conductor, and the small signal may be injected by the sink-side mode converter into a sink-side electrical conductor.

A small signal within the present embodiments is a signal, in which it is a matter of the information contained in the signal but not of the power contained in the signal. Examples of these types of signal are: a received magnetic resonance signal that is converted to a corresponding high frequency; a clock signal that is converted to a corresponding high frequency; a control signal that is converted to a corresponding high frequency (e.g., a synchronization signal or an activation signal); and a carrier signal (e.g., a sinusoidal signal) having a correspondingly high frequency.

Magnetic resonance excitation pulses that are fed, for example, to the whole body coil or to another transmit coil of the magnetic resonance system, and gradient pulses that are fed to the gradient magnet system of the magnetic resonance system are not small signals, for example.

A signal source within the present embodiments is a device that generates a small signal oscillating at the frequency of at least 20 GHz. If the small signal is generated on the basis of a low-frequency signal (e.g., a magnetic resonance signal), the signal source is thus the device, to which the lower-frequency small signal is supplied and which converts the lower-frequency small signal to the frequency of at least 20 GHz. The same applies in a reverse arrangement to the signal sink.

The small signal may be transmitted completely (e.g., not just in a part section) over a cable. However, a cable-based signal transmission is undertaken in the part section.

The mode converters are separate devices from the signal source and the signal sink. The mode converters do not carry out any frequency conversion of the small signal but merely convert the small signal from an electrical signal into a dielectric signal and vice versa.

The source-side and the sink-side electrical conductors may be cables. However, this is not necessary. The source-side and the sink-side electrical conductors may involve a short length (e.g., a few millimeters or centimeters) of a substrate or of another structure that may conduct appropriately high frequencies.

Further functional elements may be arranged between the signal source and the source-side mode converter in addition to the source-side electrical conductor. In many embodiments, however, the small signal is injected by the signal source into the source-side electrical conductor. In a similar manner, further functional units may be disposed between the sink-side mode converter and the signal sink in addition to the sink-side electrical conductor. The small signal may be supplied by the sink-side electrical conductor to the signal sink.

The small signal may be a pure carrier signal. Alternatively, the small signal may involve a modulated signal that, for example, has arisen through frequency mixing, through amplitude modulation, or through frequency modulation. In one embodiment, the small signal is a digital modulated signal (e.g., a signal that is modulated with a digital signal).

In one embodiment, the small signal contains a magnetic resonance signal received by at least one magnetic resonance receive antenna of the local coil. The magnetic resonance signal may be an analog signal, or the magnetic resonance signal may be digitized.

In the event of the small signal containing the magnetic resonance signal, the signal source may, for example, be embodied as a frequency mixer disposed within the examination volume. The frequency mixer may be supplied via an electrical cable with the magnetic resonance signal received by the at least one magnetic resonance antenna. The frequency mixer may convert the magnetic resonance signal supplied to the frequency mixer into the small signal, and the sink-side mode converter may be disposed outside the examination volume.

As an alternative, in the event of the small signal containing the magnetic resonance signal, the signal source may, for example, be embodied as a transmitter that is arranged in a local coil disposed within the examination volume. The magnetic resonance signal received by the at least one magnetic resonance receive antenna may be supplied to the transmitter. The small signal may be transmitted by the transmitter wirelessly to a GHz receive antenna disposed within the examination volume. The small signal may be injected by the GHz receive antenna into the source-side electrical conductor, the sink-side mode converter may be disposed outside the examination volume.

Regardless of the type of transmitted signal, the source-side and/or the sink-side electrical conductors may have a respective length that is smaller than the wavelength related to the highest magnetic resonance excitation frequency of the magnetic resonance system, so that the dielectric waveguide acts as a sheath current filter.

In the case of a (sinusoidal) carrier signal, the signal source may be embodied as a local oscillator disposed outside the examination volume. The signal sink may be embodied as a frequency mixer disposed within the examination volume. The frequency mixer may be supplied with an additional signal in addition to the small signal that contains a magnetic resonance signal received by at least one magnetic resonance receive antenna of a local coil.

BRIEF DESCRIPTION OF THE DRAWINGS

FIG. 1 is a schematic diagram of one embodiment of a magnetic resonance system including a signal path; and FIGS. 2 to 6 show examples of different embodiments of the signal path of FIG. 1.

DETAILED DESCRIPTION OF THE DRAWINGS

Figure 3:
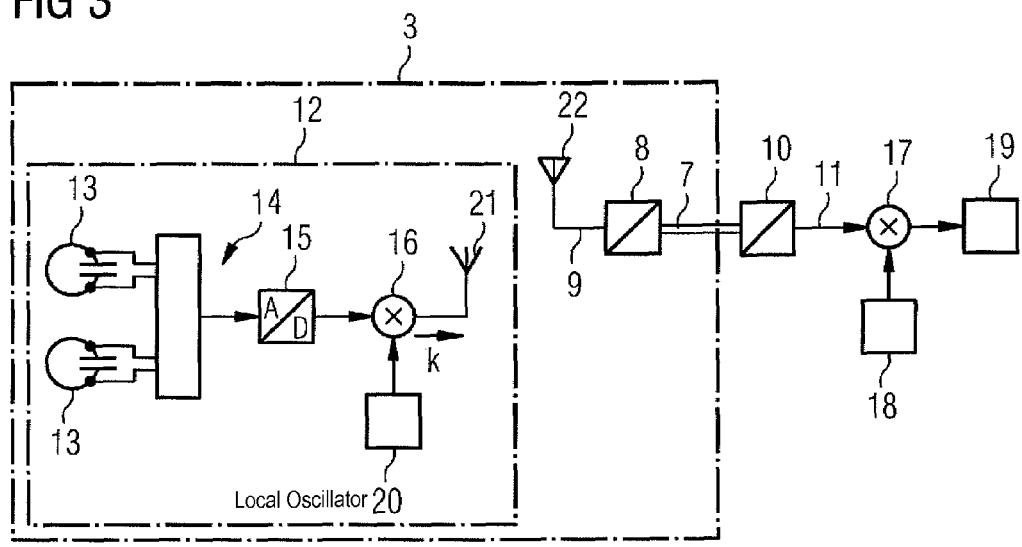

According to FIG. 1, a magnetic resonance system includes components such as a basic magnet 1 and a whole-body coil 2. The whole-body coil 2 is enclosed by the basic magnet 1 in the shape of a ring. A static, locally essentially homogeneous basic magnetic field B may be generated by the basic magnet 1 in an examination volume 3 of the magnetic resonance system. Magnetic resonance excitation pulses may be applied by the whole-body coil 2 to the examination volume 3. The magnetic resonance excitation pulses have frequencies in the range of 10s or 100s of MHz. For a basic magnetic field B of 1.5 Tesla, for the excitation of hydrogen cores to magnetic resonances, a Larmor frequency (e.g., an excitation frequency) of approximately 63.5 MHz is produced. For basic magnetic field B of 3 Tesla, a frequency of approximately 127 MHz is produced for the excitation of hydrogen cores.

In one embodiment, a signal path has a signal source 4 that generates a small signal k. The small signal k oscillates at a frequency f of at least 20 GHz. For example, the frequency f may be 60 GHz, 64 GHz, 77 GHz or more. In one embodiment, the frequency f may be greater than 100 GHz (e.g., up to 150 GHz).

The small signal k is transmitted by the signal source 4 to a signal sink 5. The signal sink 5 processes the small signal k.

The small signal k, on the way from the signal source 4 to the signal sink 5, may be transmitted partly wirelessly. This is indicated in FIG. 1 by the corresponding dashed lines that start from the signal source 4 and end at the signal sink 5. The small signal k is transmitted over a cable at least in a part section 6 of the signal path. This is indicated in FIG. 1 by corresponding solid lines.

The part section 6 of the signal path, in which the small signal k is transmitted over a cable, is at least partly embodied as a dielectric waveguide 7. Dielectric waveguides are known and described in more detail, for example, in the textbook "The Essence of Dielectric Waveguides", Yeh and Shimabukuro, Springer Verlag 2008.

The dielectric waveguide 7, in accordance with FIG. 1, is delimited on a source side by a source-side mode converter 8. Disposed on the source side of the source-side mode converter 8 is a source-side electrical conductor 9. The small signal k is supplied by the source-side electrical conductor 9 to the source-side mode converter 8. The source-side mode converter 8 converts the electrical small signal k supplied to the source-side mode converter 8 into a dielectric small signal k and injects the electrical small signal k into the dielectric waveguide 7. The source-side mode converter 8 does not carry out any further mode conversion.

The dielectric waveguide 7, in accordance with FIG. 1, is also delimited on a sink side by a sink-side mode converter 10. Disposed on the sink side of the sink-side mode converter 10 is a sink-side electrical conductor 11. The sink-side electrical conductor 10 converts the dielectric small signal k supplied to the sink-side electrical conductor 10 into an electrical small signal k and injects the electrical small signal k into the sink-side electrical conductor 11. The sink-side mode converter 10 does not carry out any further mode conversion.

The dielectric waveguide 7 is disposed at least partly (e.g., under some circumstances, even completely) within the examination volume 3 of the magnetic resonance system. One of the mode converters 8 is thus likewise disposed within the examination volume 3. Whether, as shown in FIG. 1, the source-side mode converter 8, the sink-side mode converter 10, or both the source-side mode converter 8 and the sink-side mode converter 10 are disposed in the examination volume 3, is of secondary importance within the context of the present embodiments.

In some embodiments, the entire dielectric waveguide 7 and thus also the source-side mode converter 8 and the sink-side mode converter 10 may be disposed within the examination volume 3. This will become more evident from the explanation of the embodiments in accordance with FIGS. 2 to 6.

In the embodiment in accordance with FIG. 2, two dielectric waveguides 7 are present. One of the dielectric waveguides 7 is used for the transmission of an unmodulated carrier signal. The other dielectric waveguide 7 is used for the transmission of a modulated carrier signal. Both carrier signals are small signals k within the present embodiments.

In accordance with FIG. 2, a local coil 12 of the magnetic resonance system has at least one magnetic resonance receive antenna 13. The magnetic resonance receive antenna 13 is used for receiving a magnetic resonance signal excited beforehand in an object under examination (e.g., the patient)

not shown in the figure. The magnetic resonance signal has a Larmor frequency. The Larmor frequency corresponds to the excitation frequency. The Larmor frequency thus lies in the 10s to 100s MHz range.

The received magnetic resonance signal is supplied to processing electronics 14 and is pre-processed at the processing electronics 14. For example, a pre-amplification and/or filtering may be undertaken. The pre-processing electronics may combine the magnetic resonance signals of a number of receive antennas 13 with each other (e.g., the received magnetic resonance signals of two receive antennas 13 oriented orthogonally to one another). For example, the processing electronics 14, as shown in FIG. 2, may include an analog-digital converter 15, using which the received magnetic resonance signal is digitized.

The analog or digitized magnetic resonance signal is supplied to a local coil-side frequency mixer 16. The local coil-side frequency mixer 16 is also supplied with a carrier signal having a carrier frequency of at least 20 GHz. The local coil-side frequency mixer 16, on the basis of the two signals supplied to the local coil-side frequency mixer 16, generates a modulated carrier signal, the frequency of which is in the range of the 20 GHz. The local coil-side frequency mixer 16 corresponds to a signal source within the present embodiments.

The local coil-side frequency mixer 16 may be integrated into the local coil 12. Regardless of whether the local coil-side frequency mixer 16 is integrated into the local coil 12 or not, the local coil-side frequency mixer 16 is, however, disposed within the examination volume 3.

The local coil-side frequency mixer 16 injects the modulated carrier signal (e.g., directly) into the source-side electrical conductor 9. The modulated carrier signal is supplied by the source-side mode converter 8, the dielectric waveguide 7, the sink-side mode converter 10 and the sink-side electrical conductor 11 to a controller-side frequency mixer 17.

The controller-side frequency mixer 17 is arranged outside the examination volume 3. The controller-side frequency mixer 17 is supplied with an unmodulated carrier signal in addition to the modulated carrier signal. The unmodulated carrier signal may have the same frequency as the unmodulated carrier signal supplied to the local coil-side frequency mixer 16. For example, the two unmodulated carrier signals may be generated by the same local oscillator 18. At least the carrier frequency of the unmodulated carrier signal supplied to the controller-side frequency mixer 17 lies in the same frequency range however (e.g., maximum +/−10%, maximum +/−5 GHz; the smaller value applies) as the unmodulated carrier signal supplied to the local coil-side frequency mixer 16.

The controller-side frequency mixer 17 corresponds to a signal sink within the present embodiments. The controller-side frequency mixer 17 extracts the original signal, using which the local coil-side frequency mixer 16 has modulated the carrier signal unmodulated from the modulated carrier signal. The extracted, significantly lower frequency, signal is supplied by the controller-side frequency mixer 17 to a control and evaluation device 19 of the magnetic resonance system. The control and evaluation device 19 carries out the actual payload evaluation of the received magnetic resonance signal.

The lengths of the source-side electrical conductor 9, the sink-side electrical conductor 11 and the dielectric waveguide 7 may be determined, as required. For example, the source-side electrical conductor 9 and the sink-side electrical conductor 11 may be rather short (e.g., a length in millimeters in the single digit or two-digit range).

The previously described embodiment of FIG. 2 realizes the following advantageous embodiments. The small signal k is injected by the signal source 16 into the source-side electrical conductor 9. The small signal k is supplied (e.g., directly) by the sink-side electrical conductor 11 to the signal sink 17. The small signal k is a digitally modulated signal. The small signal k contains a magnetic resonance signal that has been received by a magnetic resonance receive antenna 13 of a local coil 12.

The modulation may alternatively be undertaken with another signal (e.g., with a clock signal). The direction, in which the signal runs, may also be reversed.

The unmodulated carrier signals supplied to the two frequency mixers 16, 17 may be generated by the same local oscillator 18. The unmodulated carrier signal is transferred by the local oscillator 18 that is disposed outside the examination volume 3 to the local coil-side frequency mixer 16. This may be undertaken by an embodiment of a signal path, as is also explained below in conjunction with FIG. 2.

In accordance with FIG. 2, the local oscillator 18 also corresponds to a signal source within the present embodiments. The local oscillator 18 is connected via a source-side electrical conductor 9, a source-side mode converter 8, a dielectric waveguide 7, a sink-side mode converter 10 and a sink-side electrical conductor 11 to the local coil-side frequency mixer 16. In relation to the signal path, the local coil-side frequency mixer 16 corresponds to a signal sink within the present embodiments.

In relation to the signal path, FIG. 2 shows the following embodiments. The small signal k is injected by the signal source 18 into the source-side electrical conductor 9. The small signal k is supplied by the sink-side electrical conductor 11 to the signal sink 16. The small signal k is an unmodulated carrier signal.

FIG. 3 shows, in as far as it relates to the transfer of the magnetic resonance signal, a similar embodiment to FIG. 2. In accordance with FIG. 3, the local coil 12 has a local oscillator 20, however. The unmodulated carrier signal for the local coil-side frequency mixer 16 is thus generated independently on the local coil 12 side but is not transferred from outside the examination volume 3 to the local coil 12. The local coil-side frequency mixer 16 is not connected directly to the source-side electrical conductor 9, but injects the modulated carrier signal into a transmit antenna 21. The signal source (e.g., the frequency mixer 16) is thus still disposed in the embodiment of FIG. 3 within the examination volume 3. The digitized magnetic resonance signal of the magnetic resonance receive antenna 13 is also supplied to the signal source. The signal source is however embodied as a transmitter, from which the modulated carrier signal (e.g., the small signal k within the present embodiments) is transmitted wirelessly to a receive antenna 22. The GHz receive antenna 22 is disposed (e.g., at a fixed location of the examination volume 3) and injects the modulated carrier signal that the GHz receive antenna 22 receives into the source-side electrical conductor 9. The source-side electrical conductor 9 is connected to the source-side mode converter 8. A preamplifier (not shown in the diagram) may be disposed between the GHz receive antenna 22 and the source-side mode converter 8. The sink-side mode converter 10 is, as in FIG. 2, disposed outside the examination volume 3.

The lengths of the source-side electrical conductor 9, the sink-side electrical conductor 11 and the dielectric waveguide 7 may also, as in FIG. 2, be determined as required. For example, the two electrical conductors 9, 11 may be relatively short.

The exemplary embodiment in accordance with FIG. 3 realizes the following advantageous embodiments. The small signal k is supplied by the sink-side electrical conductor 11 to the signal sink 17. The small signal k is a digitally modulated signal. The small signal k contains the magnetic resonance signal already explained in conjunction with FIG. 2.

Figure 4:
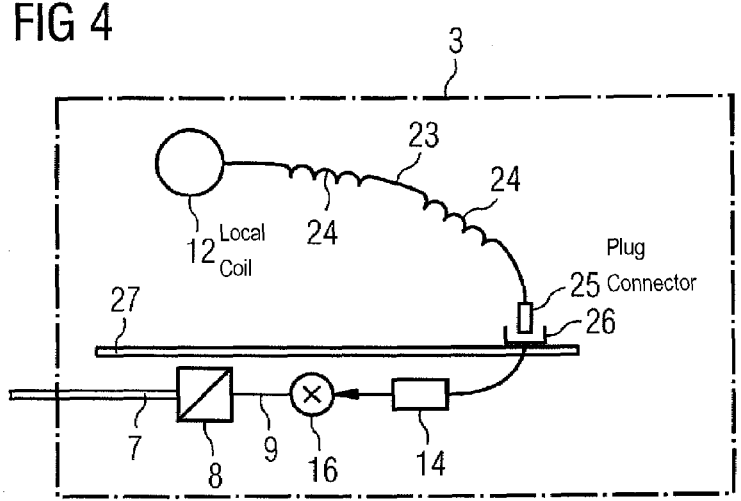

FIG. 4 shows a further embodiment of the signal path. In this embodiment, the small signal k contains a magnetic resonance signal.

In accordance with FIG. 4, the local coil 12 is connected via a normal cable 23 that contains sheath current filters 24, if necessary, to a plug connector 25. The plug connector 25 is inserted into a socket 26 that is arranged at a fixed location in relation to the examination volume 3 or a patient bed 27. The socket 26 is disposed downstream of processing electronics 14. The processing electronics 14 may, as in FIG. 2, carry out filtering, a combination of magnetic resonance signals or an analog-digital conversion, for example. The signal that is obtained is supplied to the local coil-side frequency mixer 16. The local coil-side frequency mixer 16 has the same function and method of operation as the local coil-side frequency mixer 16 of FIG. 2. The local coil-side frequency mixer 16 thus modulates an unmodulated carrier signal having a frequency of at least 20 GHz with the signal that is supplied to the local coil-side frequency mixer 16 by the processing electronics.

The further signal flow, including the unmodulated carrier signal to the local coil-side frequency mixer 16, corresponds to the embodiment explained in conjunction with FIG. 2.

The embodiment of FIG. 4 thus shows the following advantageous embodiments. The small signal k is injected by the signal source 16 into the source-side electrical conductor 9. The small signal k is supplied by the sink-side electrical conductor 11 to the signal sink 17. The small signal k is a digitally modulated signal. The small signal k contains the magnetic resonance signal received by the magnetic resonance receive antenna 13 of the local coil 12.

As already explained in FIG. 2, the local coil-side frequency mixer 16 uses the unmodulated carrier signal as an input signal. The unmodulated carrier signal may be supplied to the local coil-side frequency mixer 16 in the same way as is depicted in FIG. 2.

Figure 5:
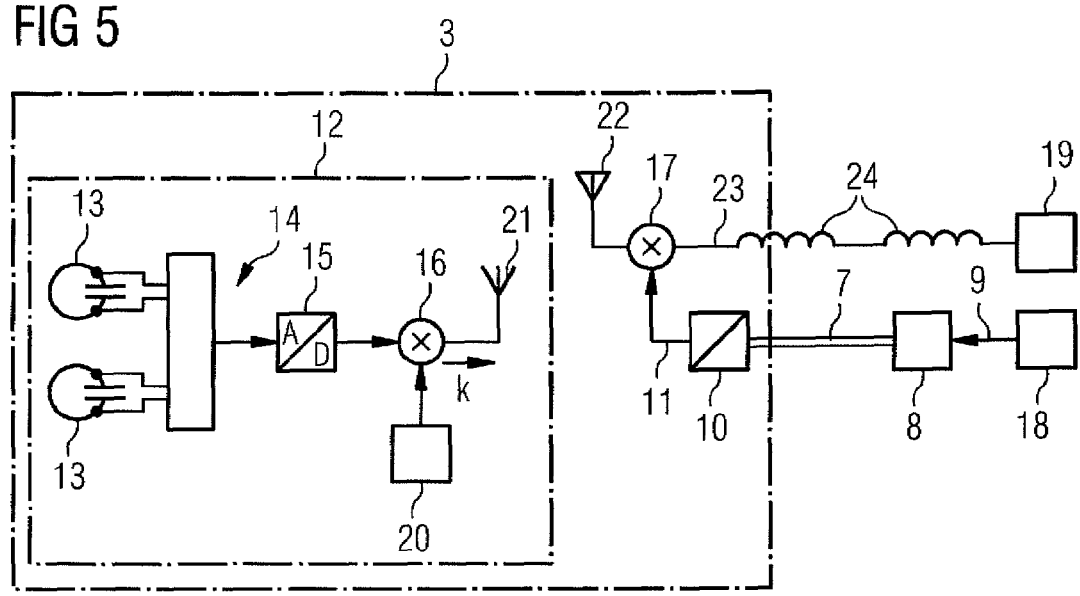

FIG. 5 shows a further embodiment of the signal path that builds on the embodiment depicted in FIG. 3. Like the embodiment depicted in FIG. 3, in the embodiment of FIG. 5, the carrier signal modulated with the received (e.g., digitized) magnetic resonance signal is transmitted wirelessly to the GHz receive antenna 22. The GHz receive antenna 22 supplies the modulated carrier signal to the controller-side frequency mixer 17. The controller-side frequency mixer 17 is disposed in the embodiment depicted in FIG. 5 within the examination volume 3. The controller-side frequency mixer 17 corresponds in the embodiment of FIG. 5 to a signal sink within the present embodiments.

The controller-side frequency mixer 17 is supplied by the local oscillator 18, which is disposed outside the examination volume 3 with the associated unmodulated carrier signal. The unmodulated carrier signal has a frequency of at least 20 GHz. The local oscillator 18 corresponds in the embodiment of FIG. 5 to the signal source within the present embodiments. The unmodulated carrier signal is supplied by the local oscillator 18 to the controller-side frequency mixer 17 in accordance with FIG. 5 via the source-side electrical conductor 9, the source-side mode converter 8, the dielectric waveguide 7, the sink-side mode converter 10 and the sink-side electrical conductor 11.

The controller-side frequency mixer 17 mixes the carrier signal modulated via the GHz receive antenna 22 with the unmodulated carrier signal and thus determines a significantly lower frequency signal. The significantly lower frequency signal is transmitted via a normal cable 23 that, if necessary, may contain sheath current filters 24, to the control and evaluation device 19.

The embodiment in accordance with FIG. 5 thus realizes the following embodiments. The small signal k is injected by the signal source 18 into the source-side electrical conductor 9. The small signal k is supplied by the sink-side electrical conductor 11 to the signal sink 17. The small signal k is an unmodulated carrier signal.

Figure 6:
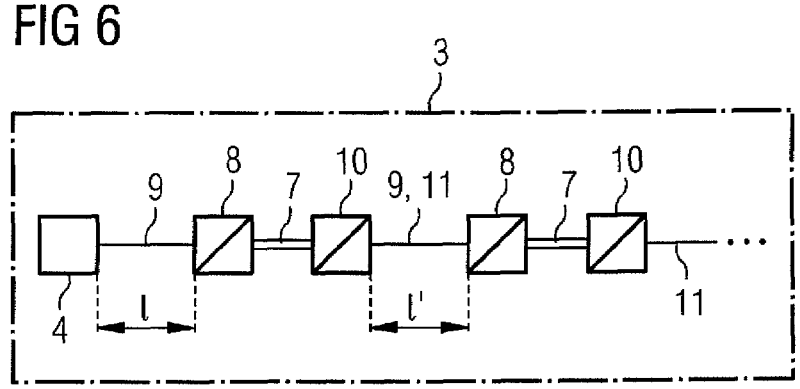

FIG. 6 shows an exemplary embodiment of the signal path. The exemplary embodiment of FIG. 6 may be combined with each of the exemplary embodiments given above, provided a small signal k is to be transmitted over a cable in the embodiments.

In accordance with FIG. 6, the signal source 4 is disposed within the examination volume 3. The part section 6, via which the small signal k generated by the signal source 4 will be transmitted over a cable, is arranged at least partly within the examination volume 3.

In the exemplary embodiment of FIG. 6, the dielectric waveguide 7 may have any given length. The dielectric waveguide 7 may be very short (e.g., only a few millimeters or centimeters). The source-side and/or the sink-side electrical conductors 9, 11 have a respective length l, 1' that is less than the wavelength related to the highest magnetic resonance excitation frequency of the magnetic resonance system. In the dielectric waveguide 7, the signal transmission is not electrical but dielectrical. The dielectric waveguide 7 thus acts as a sheath current filter. A sheath wave may therefore only build in the electrical conductors 9, 11 if the electrical conductors 9, 11 are sufficiently long (e.g., longer than the wavelength or half of the wavelength).

If necessary, in accordance with FIG. 6, a number of part sections 6 may follow after one another. In this case, the sink-side electrical conductor 11 of a part section considered is identical to the source-side electrical conductor 9 of the following part section 6.

The methods of operation explained above in conjunction with FIGS. 3, 4 and 6 may, like FIG. 2, also be realized for other payload signals to be transmitted, with which the carrier signal is modulated, and/or in the reverse signaling direction.

The present embodiments have many advantages. For example, a low-loss and flexible, wideband and low-cost transmission of signals having frequencies of 20 Ghz is possible both in the mechanical and also in the technical design sense.

The above description serves exclusively to explain the present embodiments. The scope of protection of the present invention is to be defined exclusively by the enclosed claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A signal path for a small signal oscillating at a frequency of at least 20 GHz occurring in a magnetic resonance system, the signal path comprising:
    a signal source operable to generate the small signal and a
        signal sink operable to process the small signal, the small signal, on a path from the signal source to the signal sink, being transmittable at least in a part section via a cable, wherein the part section is configured at least partly as a dielectric waveguide, the dielectric waveguide being disposed at least partly within an examination volume of the magnetic resonance system and being delimited on a source side by a source-side mode converter and on a sink side, by a sink-side mode converter, wherein the small signal is suppliable to the source-side mode converter via a source-side electrical conductor, and wherein the small signal is injectable by the sink-side mode converter into a sink-side electrical conductor.

2. The signal path as claimed in claim 1, wherein the small signal from the signal source is injectable into the source-side electrical conductor, the small signal is suppliable by the sink-side electrical conductor to the signal sink, or a combination thereof.

3. The signal path as claimed in claim 2, wherein the small signal is a digitally-modulated signal.

4. The signal path as claimed in claim 2, wherein the small signal contains a magnetic resonance signal received by at least one magnetic resonance receive antenna of a local coil of the magnetic resonance system.

5. The signal path as claimed in claim 2, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

6. The signal path as claimed in claim 2, wherein the signal source comprises a local oscillator disposed outside the examination volume, wherein the signal sink comprises a frequency mixer disposed inside the examination volume, and wherein an additional signal is suppliable to the frequency mixer in addition to the small signal that contains a magnetic resonance signal received by at least one magnetic resonance receive antenna of a local coil.

7. The signal path as claimed in claim 1, wherein the small signal is a digitally-modulated signal.

8. The signal path as claimed in claim 7, wherein the small signal contains a magnetic resonance signal received by at least one magnetic resonance receive antenna of a local coil of the magnetic resonance system.

9. The signal path as claimed in claim 7, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

10. The signal path as claimed in claim 1, wherein the small signal contains a magnetic resonance signal received by at least one magnetic resonance receive antenna of a local coil of the magnetic resonance system.

11. The signal path as claimed in claim 10, wherein the signal source comprises a frequency mixer disposed within the examination volume, the frequency mixer being supplied, via an electrical cable, with the magnetic resonance signal received by the at least one magnetic resonance receive antenna, wherein the frequency mixer is operable to convert the magnetic resonance signal applied to the frequency mixer into the small signal, and wherein the sink-side mode converter is disposed outside the examination volume.

12. The signal path as claimed in claim 11, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

13. The signal path as claimed in claim 10, wherein the signal source comprises a transmitter that is disposed within a local coil disposed within the examination volume and is supplied with the magnetic resonance signal received by the at least one magnetic resonance receive antenna, wherein the transmitter is operable to transmit the small signal wirelessly to a GHz receive antenna disposed within the examination volume, wherein the GHz receive antenna is operable to inject the small signal into the source-side electrical conductor, and wherein the sink-side mode converter is disposed outside the examination volume.

14. The signal path as claimed in claim 13, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

15. The signal path as claimed in claim 10, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

16. The signal path as claimed in claim 1, wherein the source-side electrical conductor, the sink-side electrical conductors, or a combination thereof have a respective length that is less than a wavelength related to the highest magnetic resonance excitation frequency of the magnetic resonance system, so that the dielectric waveguide acts as a sheath current filter.

17. The signal path as claimed in claim 1, wherein the signal source comprises a local oscillator disposed outside the examination volume, wherein the signal sink comprises a frequency mixer disposed inside the examination volume, and wherein an additional signal is suppliable to the frequency mixer in addition to the small signal that contains a magnetic resonance signal received by at least one magnetic resonance receive antenna of a local coil.

* * * * *